US007323366B2

(12) United States Patent
Takahashi

(10) Patent No.: US 7,323,366 B2
(45) Date of Patent: Jan. 29, 2008

(54) MANUFACTURING METHOD OF A SEMICONDUCTOR DEVICE

(75) Inventor: Noriyuki Takahashi, Nanae (JP)

(73) Assignee: Renesas Technology Corp., Tokyo (JP)

( * ) Notice: Subject to any disclaimer, the term of this patent is extended or adjusted under 35 U.S.C. 154(b) by 13 days.

(21) Appl. No.: 11/222,959

(22) Filed: Sep. 12, 2005

(65) Prior Publication Data

US 2006/0079028 A1 Apr. 13, 2006

(30) Foreign Application Priority Data

Sep. 30, 2004 (JP) ............................. 2004-285839

(51) Int. Cl.
*H01L 21/00* (2006.01)
(52) U.S. Cl. ................ 438/111; 438/123; 257/E23.031
(58) Field of Classification Search ................ 257/692, 257/748; 438/110–113, 123
See application file for complete search history.

(56) References Cited

U.S. PATENT DOCUMENTS

| 6,198,171 B1 * | 3/2001 | Huang et al. ................ 257/787 |
| 6,849,931 B2 * | 2/2005 | Nakae ........................ 257/672 |
| 6,882,048 B2 * | 4/2005 | Ikenaga et al. ............. 257/736 |
| 7,109,067 B2 * | 9/2006 | Kobayashi ................... 438/126 |
| 2003/0134452 A1 * | 7/2003 | Mazzola et al. ............ 438/112 |
| 2004/0253764 A1 * | 12/2004 | Kang et al. ................. 438/112 |
| 2005/0106777 A1 * | 5/2005 | Ikenaga et al. ............. 438/106 |

FOREIGN PATENT DOCUMENTS

JP 2003-37219 2/2003

* cited by examiner

*Primary Examiner*—David A. Zarneke
*Assistant Examiner*—Jenny L Wagner
(74) *Attorney, Agent, or Firm*—Antonelli, Terry, Stout & Kraus, LLP.

(57) ABSTRACT

A method of making a semiconductor device including a semiconductor chip having a plurality of pads, and a lead frame having a plurality of leads. Each of the plurality of leads has a mounting surface for mounting the semiconductor device, a wire connection surface having a thick portion, and a thin portion whose thickness is thinner than the thick portion. The length of each wire connection surface was furthermore formed shorter than the mounting surface, by arranging so that the thin portion of each lead dives below the semiconductor chip, securing the length of the mounting surface of each lead, a distance from the side face of the semiconductor chip to the side face of a molded body of the semiconductor device being shortened as much as possible, and the package size is brought close to chip size, with miniaturization of QFN.

26 Claims, 17 Drawing Sheets

MANUFACTURING METHOD OF A SEMICONDUCTOR DEVICE

CROSS-REFERENCE TO RELATED APPLICATION

The present application claims priority from Japanese patent application No. 2004-285839 filed on Sep. 30, 2004, the content of which is hereby incorporated by reference into this application.

1. Field of the Invention

The present invention relates to a manufacturing technology of a semiconductor device, and particularly relates to an effective technology in the application to the miniaturization of a semiconductor device.

2. Description of the Background Art

A conventional plastic molded type semiconductor device consists of a semiconductor element mounted by adhesives on the die pad part, a plurality of inner lead parts whose tip parts were arranged opposing to the die pad part, a metal thin wire having connected the semiconductor element and the inner lead part, and sealing resin having molded the enclosure. Even if an upset structure in a die pad part is not formed, the edge part of the mounted semiconductor element can be made to approach the tip part top face of an inner lead part, since the tip part of an inner lead part has the thin thick portion which deleted top-face thickness (for example, refer to Patent Reference 1).

[Patent Reference 1] Japanese Unexamined Patent Publication No. 2003-37219 (FIG. 1)

SUMMARY OF THE INVENTION

As for the semiconductor device such as QFN (Quad Flat Non-leaded Package), a part of each lead is arranged exposing in the edge part of the back surface of a molded body, and serves as an external terminal. In such QFN, the semiconductor device of the package size near chip size is demanded with further miniaturization and making thinner.

In QFN, generally, an inner lead (wire connection surface of a lead) and an outer lead (mounting surface of a lead) are the same length, or the bite (slip prevention) and adhesion to the resin for moldings of a lead are taken into consideration lengthening the inner lead (wire connection surface).

With this structure, in order to bring package size close to chip size, it is necessary to shorten a lead. If a lead is shortened, the mounting surface of the lead corresponding to an outer lead will become short. As a result, terminal area after substrate mounting becomes small, and the problem that the bond strength and the electrical property after substrate mounting fall arises.

Said Patent Reference 1 has the description about the technology which mounts a big semiconductor element in the possible range, without changing package size, and improves the package share in CSP (Chip Scale Package). However, there is no disclosure about the technology of realizing bringing package size close to chip size paying attention to the distance from the side face of a semiconductor chip to the side face of a molded body, and aiming at the miniaturization of a semiconductor device.

The purpose of the present invention is to offer the manufacturing method of the semiconductor device which can bring package size close to chip size, and can aim at a miniaturization.

The above-described and the other objects and novel features of the present invention will become apparent from the description herein and accompanying drawings.

Of the inventions disclosed in the present application, typical ones will next be summarized briefly as follows.

That is, the present invention comprises the steps of: preparing a lead frame including a plurality of leads which have a first main surface being a mounting surface, and a second main surface being arranged in an opposite side of the first main surface, and having a first part, and a second part whose thickness is thinner than the first part, and in which each length of an extending direction of the second main surface was furthermore formed shorter than the first main surface, and a chip mounting part arranged inside the plurality of leads; mounting a semiconductor chip over the chip mounting part so that a back surface of the semiconductor chip and the second part of the lead may oppose; connecting an electrode of the semiconductor chip, and the second main surface of the first part of the lead with a conductive wire; forming a molded body performing resin molding of the semiconductor chip and the conductive wire so that the each first main surface of the plurality of leads may be exposed to a back surface of the molded body; and individually separating each of the plurality of leads from the lead frame; wherein in the step connecting with a conductive wire, the second main surface of the first part of the lead and the conductive wire are connected previously, and the conductive wire, and the electrode of the semiconductor chip are connected after that.

Next, the present invention comprises the steps of: preparing a lead frame including a plurality of leads which have a first main surface being a mounting surface, and a second main surface being arranged in an opposite side of the first main surface, and having a first part, and a second part whose thickness is thinner than the first part, and in which each length of an extending direction of the second main surface was furthermore formed shorter than the first main surface, and a length of an extending direction of the first part was formed shorter than the second part, and a chip mounting part arranged inside the plurality of leads; mounting a semiconductor chip over the chip mounting part so that a back surface of the semiconductor chip and the second part of the lead may oppose; connecting an electrode of the semiconductor chip, and the second main surface of the first part of the lead with a conductive wire; forming a molded body performing resin molding of the semiconductor chip and the conductive wire in the condition covering a plurality of device formation areas by which block formation was performed over the lead frame by one mold cavity of a resin-molding metal mold so that the each first main surface of the plurality of leads may be exposed to a back surface of the molded body; and individually separating each of the plurality of leads from the lead frame by dicing; wherein in the step connecting with a conductive wire, the electrode of the semiconductor chip and the conductive wire are connected previously, and the second main surface of the first part of the lead and the conductive wire are connected after that.

Advantages achieved by some of the most typical aspects of the inventions disclosed in the present application will be briefly described below.

Since the wire connection surface of the lead is formed shorter than a mounting surface, a semiconductor chip is mounted so that the back surface of a semiconductor chip and the thin portion of a lead may oppose, furthermore in wire bonding, the wire connection surface of a lead and a conductive wire are connected previously, then a conductive wire and the electrode of a semiconductor chip are connected, distance of the side face of a semiconductor chip and the side face of a molded body can be shortened by reverse bonding, without shortening the mounting surface of a lead. As a result, it becomes possible to bring package size close to chip size more, and to aim at the miniaturization of a semiconductor device, without reducing the bond strength and the electrical property after substrate mounting.

DETAILED DESCRIPTION OF THE PREFERRED EMBODIMENTS

Figure 1:
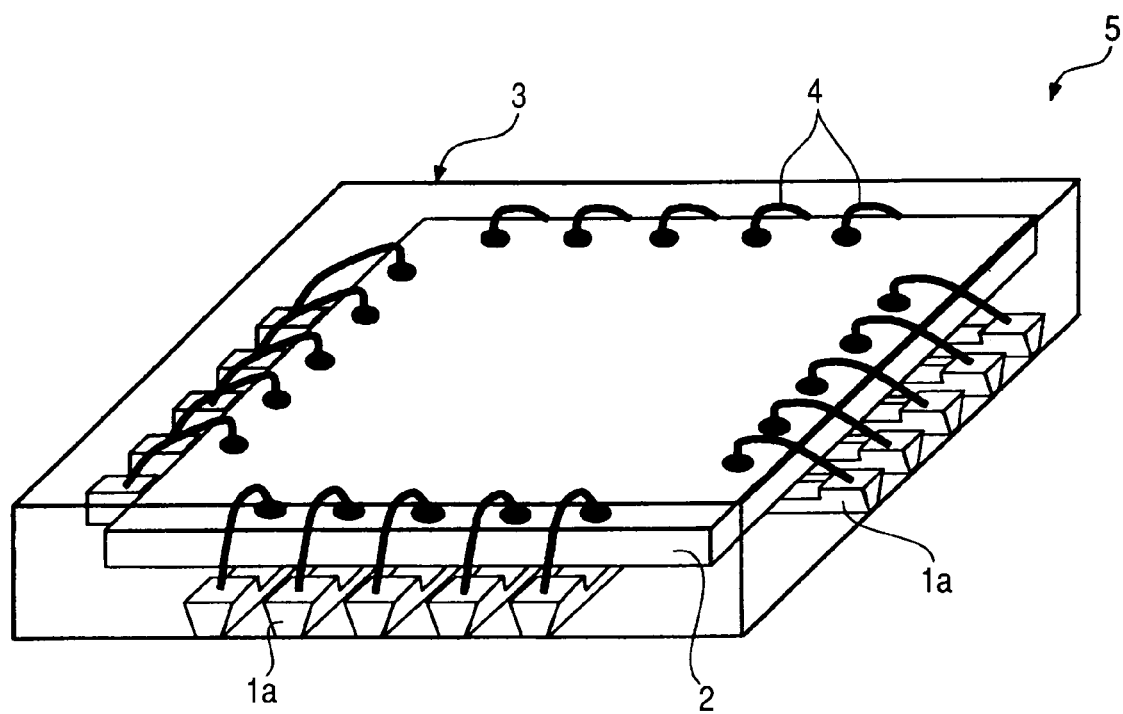
FIG. 1 is a perspective view penetrating a molded body and in which showing an example of the structure of the semiconductor device of Embodiment 1 of the present invention.

In the following embodiments, except the time when especially required, explanation of the same or same part is not repeated in principle.

Furthermore, in the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

Next, in the below-described embodiments, when a reference is made to the number of elements (including the number, value, amount and range), the number is not limited to a specific number but can be greater than or less than the specific number unless otherwise specifically indicated or principally apparent that the number is limited to the specific number.

Hereafter, embodiments of the invention are explained in detail based on drawings. In all the drawings for describing the embodiments, like members of a function will be identified by like reference numerals and overlapping descriptions will be omitted.

Embodiment 1

Figure 2:
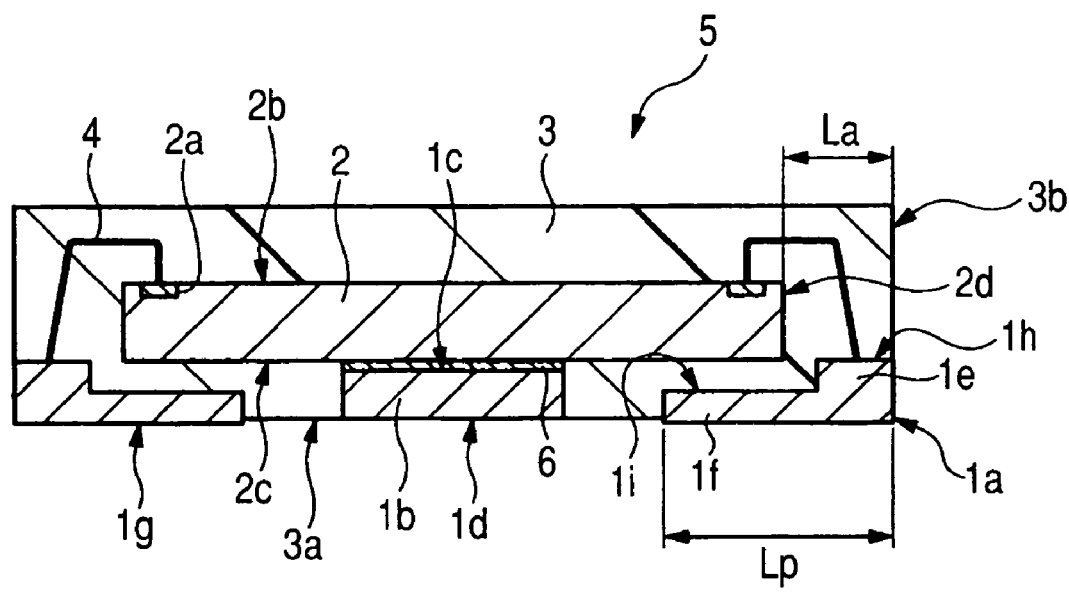
FIG. 2 is a sectional view showing the structure of the semiconductor device shown in FIG. 1.
Figure 3:
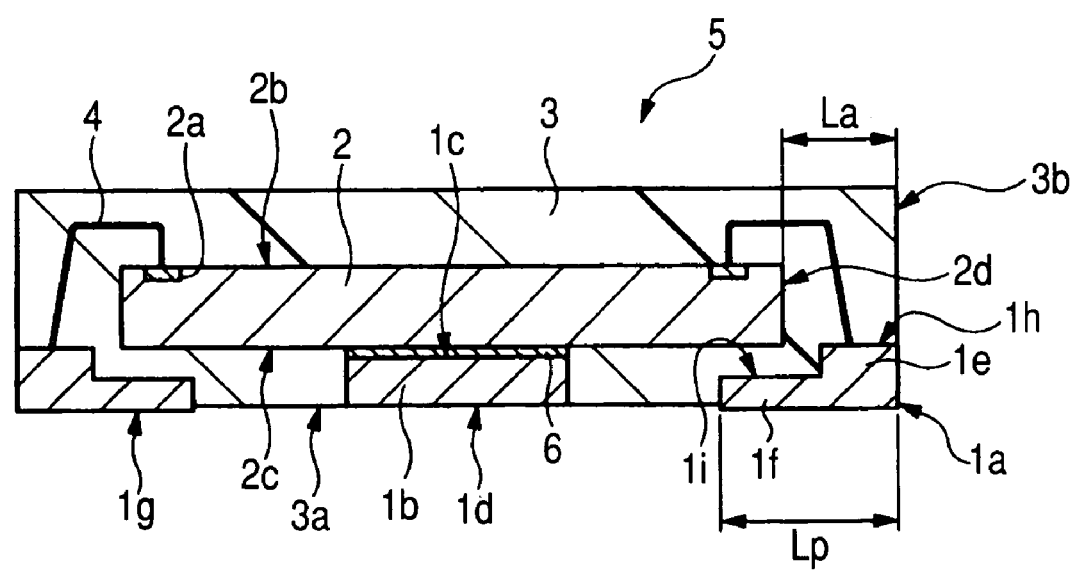
FIG. 3 is a sectional view showing an example of the short lead type structure of the semiconductor device shown in FIG. 1.

FIG. 1 is a perspective view penetrating a molded body and in which showing an example of the structure of the semiconductor device of Embodiment 1 of the present invention; FIG. 2 is a sectional view showing the structure of the semiconductor device shown in FIG. 1; FIG. 3 is a sectional view showing an example of the short lead type structure of the semiconductor device shown in FIG. 1; FIG.

Figure 5:
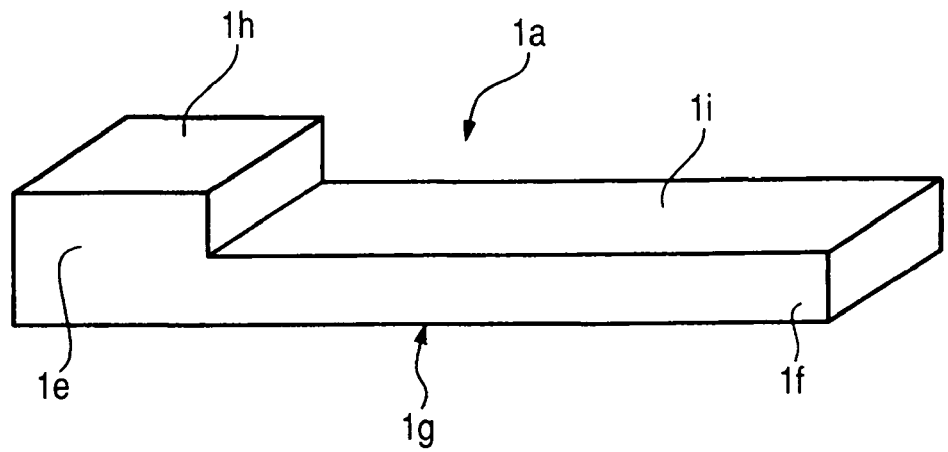
FIG. 5 is a perspective view showing an example of the structure of a lead of the semiconductor device shown in FIG. 1.
Figure 6:
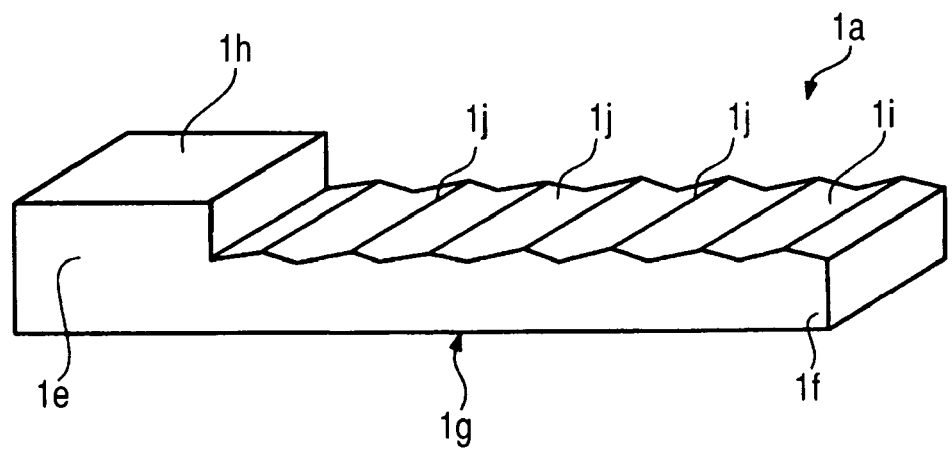
FIG. 6 is a perspective view showing the structure of a lead of the modification of the semiconductor device shown in FIG. 1.
Figure 7:
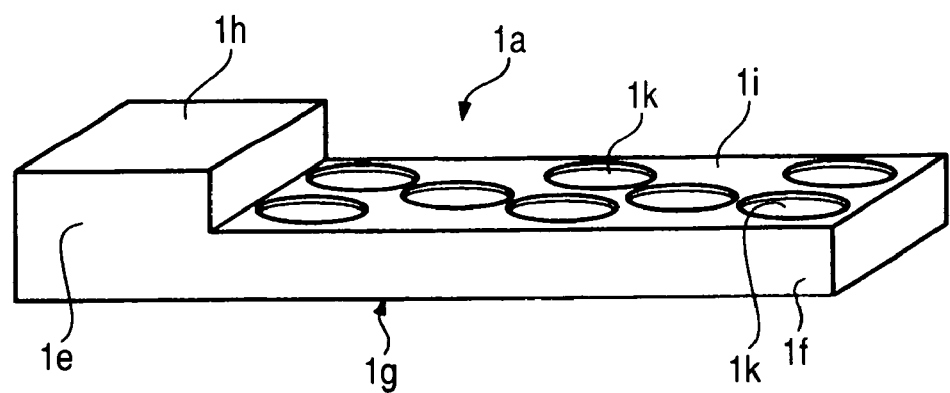
FIG. 7 is a perspective view showing the structure of a lead of the modification of the semiconductor device shown in FIG. 1.
Figure 8:
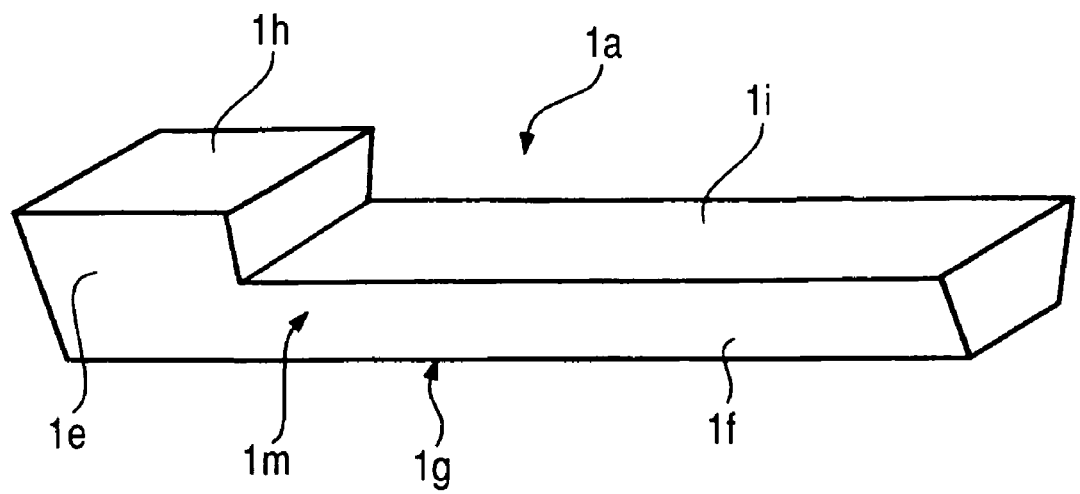
FIG. 8 is a perspective view showing an example of the structure of a lead of the inverted trapezoid of the semiconductor device shown in FIG. 1.
Figure 9:
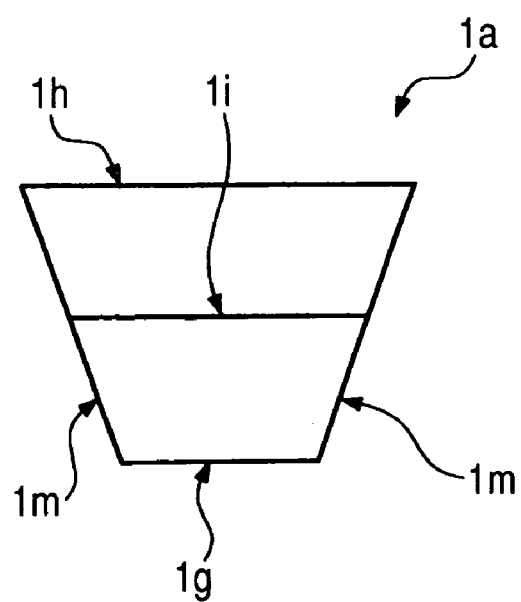
FIG. 9 is a front view showing the structure of the lead shown in FIG. 8.
Figure 10:
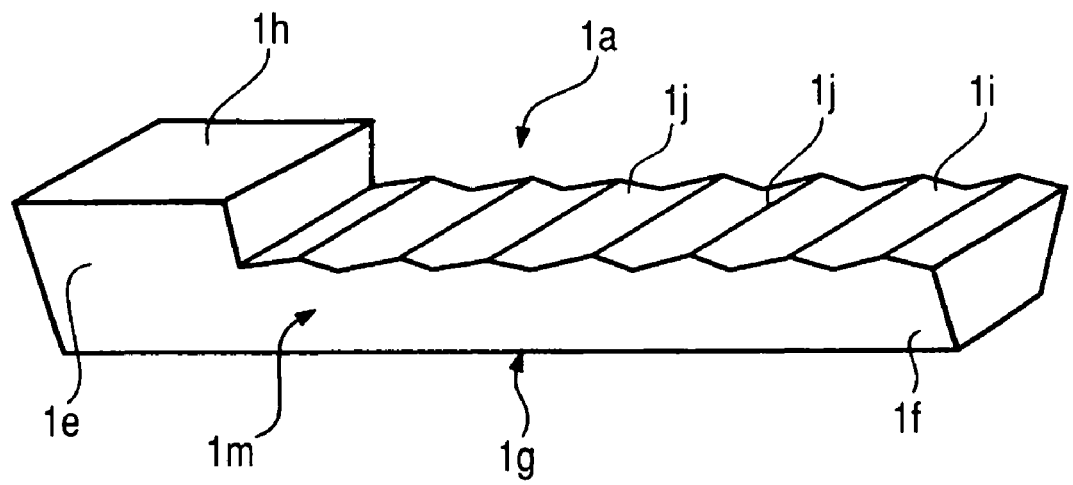
FIG. 10 is a perspective view showing the structure of the modification of a lead of the inverted trapezoid of the semiconductor device shown in FIG. 1.
Figure 11:
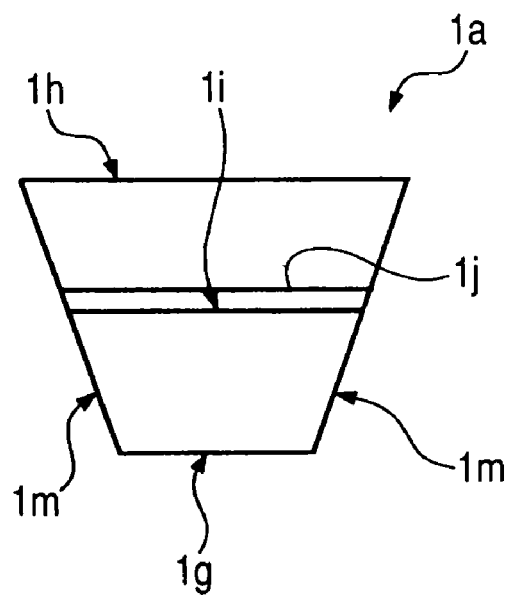
FIG. 11 is a front view showing the structure of the lead shown in FIG. 10.
Figure 12:
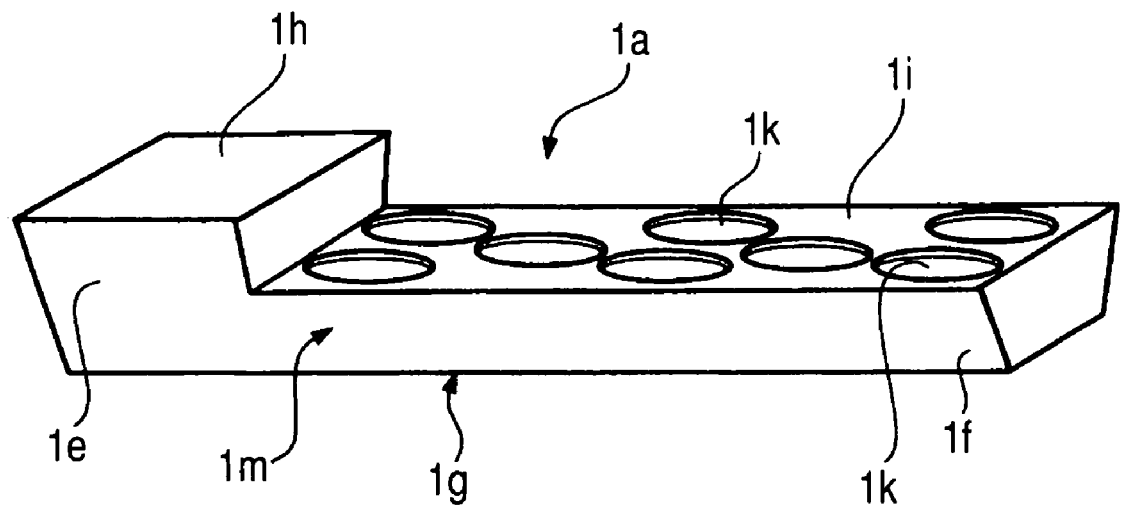
FIG. 12 is a perspective view showing the structure of the modification of a lead of the inverted trapezoid of the semiconductor device shown in FIG. 1.
Figure 13:
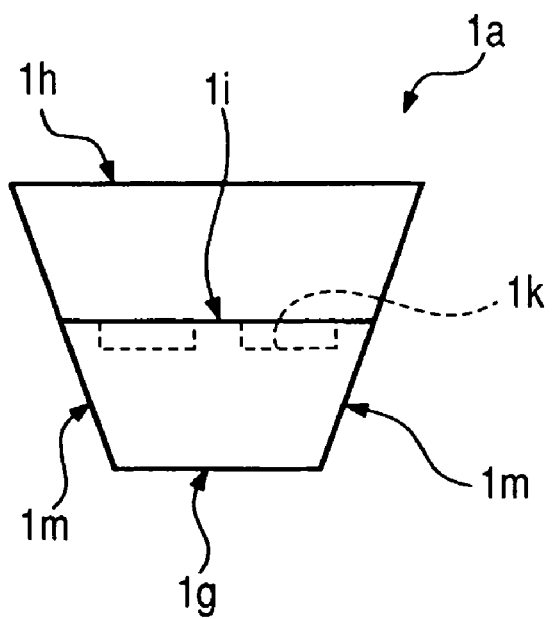
FIG. 13 is a front view showing the structure of the lead shown in FIG. 12.
Figure 14:
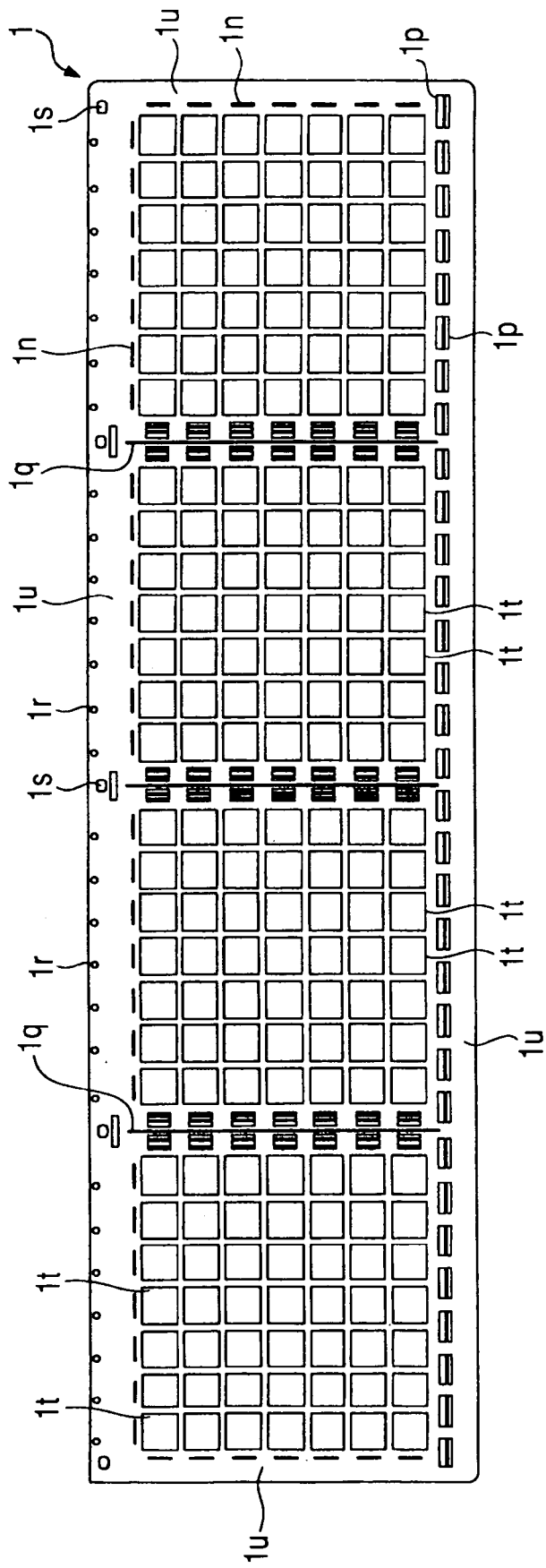
FIG. 14 is a plan view showing an example of the structure of a lead frame used for the assembly of the semiconductor device of Embodiment 1 of the present invention.
Figure 15:
FIG. 15 is a side view showing the structure of the lead frame shown in FIG. 14.
Figure 16:
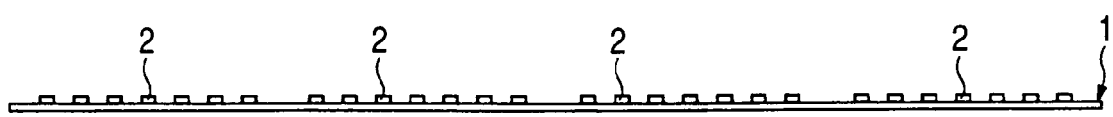
FIG. 16 is a side view showing an example of the structure after die bonding in the assembly of the semiconductor device of Embodiment 1 of the present invention.
Figure 17:
FIG. 17 is a side view showing an example of the structure after the wire bonding in the assembly of the semiconductor device of Embodiment 1 of the present invention.
Figure 18:
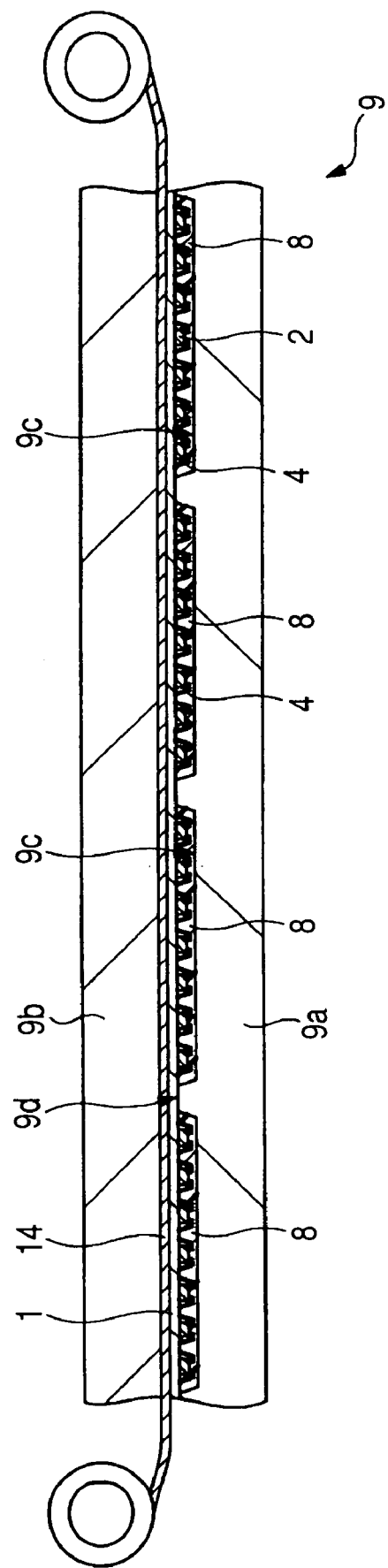
FIG. 18 is a partially sectional view showing an example of the structure at the time of resin molding in the assembly of the semiconductor device of Embodiment 1 of the present invention.
Figure 19:
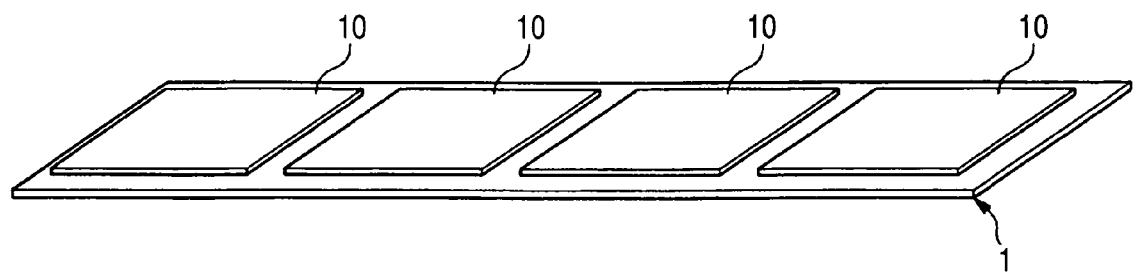
FIG. 19 is a perspective view showing the structure after resin molding.
Figure 20:
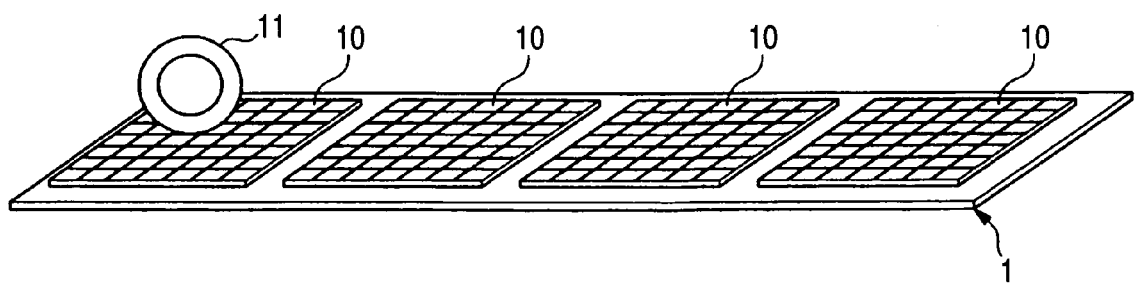
FIG. 20 is a perspective view showing an example of the structure at the time of individual separation dicing in the assembly of the semiconductor device of Embodiment 1 of the present invention.
Figure 21:
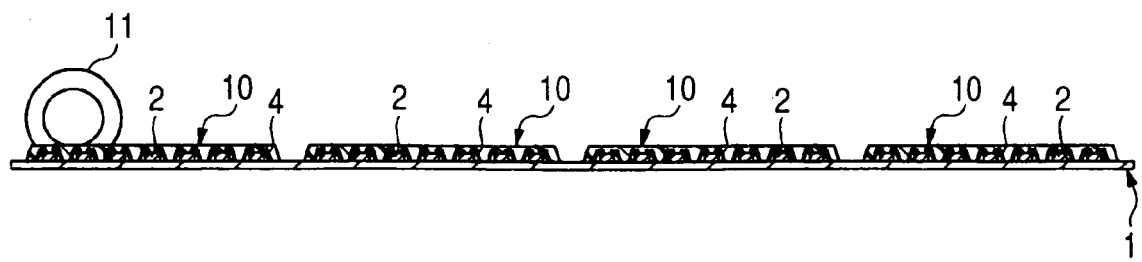
FIG. 21 is a sectional view showing the structure at the time of individual separation dicing shown in FIG. 20.
Figure 22:
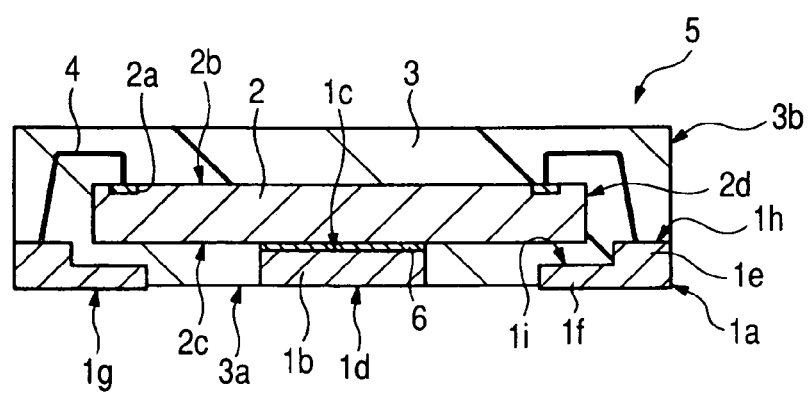
FIG. 22 is a sectional view showing an example of the structure after the assembly completion in the assembly of the semiconductor device of Embodiment 1 of the present invention.
Figure 28:
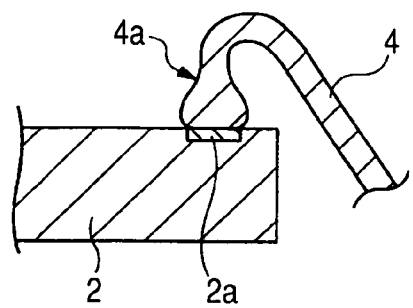
FIG. 28 is a partially expanded sectional view in wire bonding.
Figure 29:
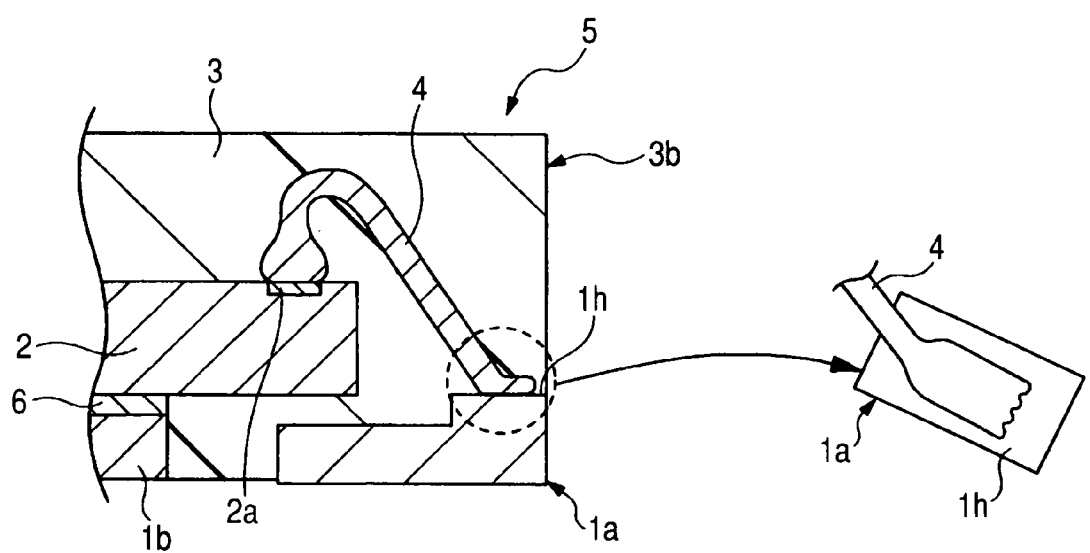
FIG. 29 is the partially expanded sectional view and partially expanded perspective view after wire bonding.
Figure 30:
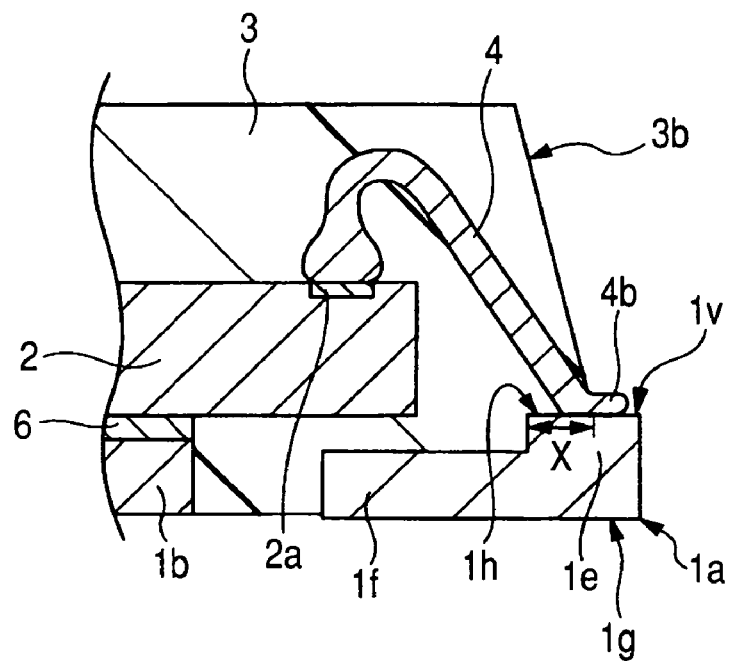
FIG. 30 is a partially expanded sectional view of the semiconductor device by individual molding.
Figure 31:
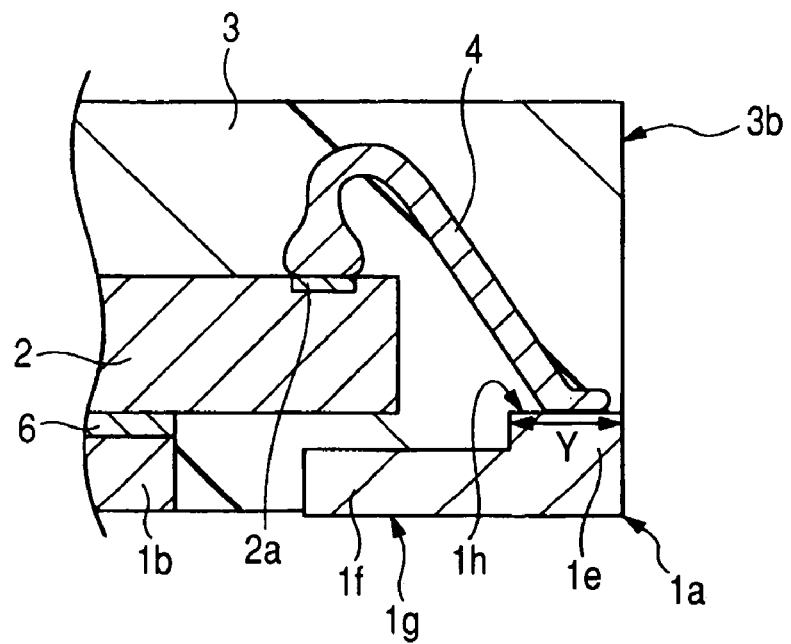
FIG. 31 is a partially expanded sectional view of the semiconductor device by a batch molding.

4 is a sectional view showing an example of the reverse bonding type structure of the semiconductor device shown in FIG. 1; FIG. 5 is a perspective view showing an example of the structure of a lead of the semiconductor device shown in FIG. 1; FIG. 6 and FIG. 7 is respectively a perspective view showing the structure of a lead of the modification of the semiconductor device shown in FIG. 1; FIG. 8 is a perspective view showing an example of the structure of a lead of the inverted trapezoid of the semiconductor device shown in FIG. 1; FIG. 9 is a front view showing the structure of the lead shown in FIG. 8; FIG. 10 is a perspective view showing the structure of the modification of a lead of the inverted trapezoid of the semiconductor device shown in FIG. 1; FIG. 11 is a front view showing the structure of the lead shown in FIG. 10; FIG. 12 is a perspective view showing the structure of the modification of a lead of the inverted trapezoid of the semiconductor device shown in FIG. 1; FIG. 13 is a front view showing the structure of the lead shown in FIG. 12; FIG. 14 is a plan view showing an example of the structure of a lead frame used for the assembly of the semiconductor device of Embodiment 1 of the present invention; FIG. 15 is a side view showing the structure of the lead frame shown in FIG. 14; FIG. 16 is a side view showing an example of the structure after die bonding in the assembly of the semiconductor device of Embodiment 1 of the present invention; FIG. 17 is a side view showing an example of the structure after the wire bonding in the assembly of the semiconductor device of Embodiment 1 of the present invention; FIG. 18 is a partially sectional view showing an example of the structure at the time of resin molding in the assembly of the semiconductor device of Embodiment 1 of the present invention; FIG. 19 is a perspective view showing the structure after resin molding; FIG. 20 is a perspective view showing an example of the structure at the time of individual separation dicing in the assembly of the semiconductor device of Embodiment 1 of the present invention; FIG. 21 is a sectional view showing the structure at the time of individual separation dicing shown in FIG. 20; FIG. 22 is a sectional view showing an example of the structure after the assembly completion in the assembly of the semiconductor device of Embodiment 1 of the present invention; FIG. 28 is a partially expanded sectional view in wire bonding; FIG. 29 is the partially expanded sectional view and partially expanded perspective view after wire bonding; FIG. 30 is a partially expanded sectional view of the semiconductor device by individual molding; and FIG. 31 is a partially expanded sectional view of the semiconductor device by a batch molding.

The semiconductor device of Embodiment 1 shown in FIG. 1 and FIG. 2 is a plastic molded type, and is a small semiconductor package, and is a thing of the non lead-type about which each mounting surface 1g of a plurality of leads 1a has been put in order and arranged being exposed to the edge part of back surface 3a of molded body 3. Embodiment 1 explains taking up QFN 5 as an example of said semiconductor device. Although QFN 5 is a small semiconductor package, it brings package size close to chip size as much as possible.

If the structure of QFN 5 is explained, it has semiconductor chip 2 having a semiconductor element and a plurality of pads (electrode) 2a in the main surface 2b, tab 1b connected to semiconductor chip 2 being a chip mounting part, a plurality of leads 1a which have mounting surfaces (the first main surface) 1g, and wire connection surfaces 1h arranged in the opposite side (the second main surface), and have thick portions (first part) 1e having wire connection surfaces 1h, and thin portions (second part) 1f with thinner thickness than thick portion 1e, the length of the extending direction of wire connection surface 1h being formed shorter than mounting surface 1g further, respectively, and the length of the extending direction in thick portion 1e having been formed shorter than the length of the extending direction in thin portions if, wires 4 which are a plurality of conductive wires connecting a plurality of pads 2a of semiconductor chip 2, and a plurality of leads 1a corresponding to these, respectively, and molded body 3 performing resin molding of semiconductor chip 2 and a plurality of wires 4.

Each lead 1a is arranged so that thin portion 1f of each lead 1a may dive into the lower part of semiconductor chip 2 and may oppose with back surface 2c of semiconductor chip 2, while the mounting surface 1g is arranged along with the edge part of back surface 3a of molded body 3.

Thus, as for QFN 5, by arranging thin portions if of each lead 1a diving into the lower part of semiconductor chip 2, while securing the length (Lp) of the lead extending direction of mounting surfaces 1g of each lead 1a exposed to back surface 3a of molded body 3 and holding the strength at the time of mounting, making distance (La) from side face 2d of semiconductor chip 2 to side face 3b of molded body 3 short as much as possible, the package size is brought close to chip size, and the miniaturization of QFN 5 is aimed.

Therefore, let the length of the lead extending direction of wire connection surface 1h of thick portion 1e of each lead 1a be minimum length required in order to connect wire 4. In Embodiment 1, the length of the extending direction in thick portion 1e is formed shorter than the length of the extending direction in thin portion 1f. Thus, distance (La) is made as short as possible.

QFN 5 of Embodiment 1, as shown in FIG. 18 in the assembly, the batch molding method of covering a plurality of device formation areas of one lead frame 1 by one mold cavity 9c of resin-molding metal mold 9, and of performing resin molding being adopted, is assembled being individually separated by dicing after that further. Therefore, since side face 3b of molded body 3 is formed almost vertically to mounting surface 1g of lead 1a, the region of molded body 3 contiguous to side faces 2d of semiconductor chip 2 can be formed in distance (La) uniformly for the height direction. Thereby, it has the structure of being easy to secure the region which arranges wire 4 in the side portion of semiconductor chip 2.

First of all, the length of the lead terminal exposed to the back surface 3a side of molded body 3 is specified as specifications, such as a mounting board which mounts QFN 5, or JEITA. For this reason, when trying to make package size thinner and to aim at miniaturization of it, the wire connection surface side (end portion which adjoins tab 1b in lead 1a) of lead 1a will contact semiconductor chip 2 (especially edge part of the back surface 2c side). Then, like Embodiment 1, thin portion 1f was formed in the wire connection surface 1h side of lead 1a, and contact of semiconductor chip 2 and lead 1a is prevented. If lead 1a is only thinly formed at this time, since; on the miniaturization of package size, the distance from side face 2d of semiconductor chip 2 to side face 3b of molded body 3 becomes short and the vertical interval of the first bonding part and the second bonding part moreover becomes large, wire bonding will be performed to a steep angle. If wire bonding is performed to a steep angle, as shown in FIG. 28, a stress will concentrate on root part 4a at which wire 4 is pulled out from the stud bump formed in the first bonding side by wire bonding technology, and it will become a cause of an open circuit near said root part 4a. Thus, wire connection surface 1*h* by the side of second bonding leave the thickness as thick portion 1*e*, and reduce the vertical interval of the first bonding point and the second bonding point so that the stress leading to an open circuit may not arise. Here, in order to fully miniaturize package size, as to thick portion 1*e* having wire connection surface 1*h*, only the region (length) in which wire bonding is possible is formed, and the other region is thinly formed as thin portion 1*f*. In Embodiment 1, the region (length) of thick portion 1*e* is formed smaller (narrowly) than thin portion 1*f*. Thereby, contact of semiconductor chip 2 and lead 1*a* is suppressed, and the miniaturization of package size can be aimed.

Figure 23:
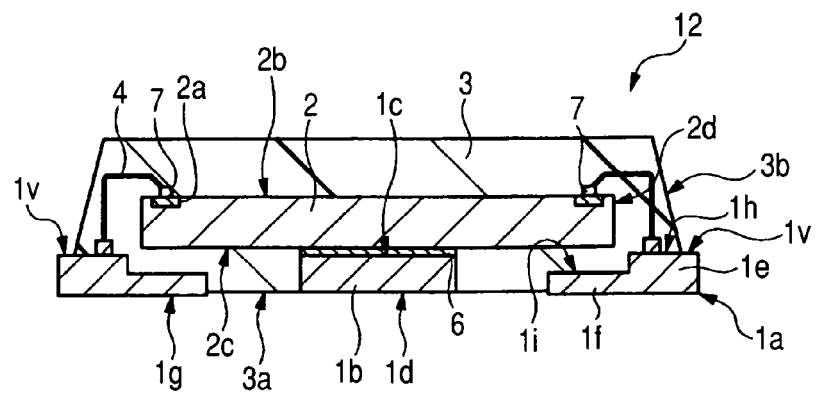
FIG. 23 is a sectional view showing an example of the structure of the semiconductor device of Embodiment 2 of the present invention.

When forming wire 4 by forward bonding, as shown in FIG. 29, since the second bonding side is stuck to wire connection surface 1*h* of lead 1*a* by pressure so that wire 4 may be torn off, it becomes larger than the bonding area at the side of the first bonding. If molded body 3 is formed by individual molding which covers and performs resin molding of the one device region it by one mold cavity 9*c* with a taper, as shown in FIG. 23, side face 3*b* of molded body 3 turns into a slope, and since performing resin molding in the condition that lead 1*a* is clamped with a metal mold, cutting margin 1*v* is formed. For this reason, region (length) X of wire connection surface 1*h* for striking the second bonding becomes small (narrowly).

As a result, as shown in FIG. 30, in the case of the second bonding, wire end portion 4*b* is exposed from side face 3*b* of molded body 3, and becomes a short defective cause. However, if molded body 3 is formed by a batch molding as shown in FIG. 2, side face 3*b* of molded body 3 is formed to wire connection surface 1*h* of lead 1*a* almost perpendicularly, and cutting margin 1*v* which is formed at the time of the clamp of lead 1*a* will not be formed. Therefore, since region (length) Y of wire connection surface 1*h* of lead 1*a* to which the second bonding is struck, can secure more widely than an individual molding type as shown in FIG. 30 as shown in FIG. 31 (X<Y), the problem of exposing from side face 3*b* of molded body 3 can be suppressed.

Thin portion 1*f* of each lead 1*a* is thinly formed in about ½ thickness of thick portion 1*e* by half etching processing, press working, etc., for example. For example, when the thickness of lead frame 1 (refer to FIG. 14) is 0.2 mm, thick portion 1*e* of each lead 1*a* and the thickness of tab 1*b* are set to 0.2 mm, and thin portions if become about ½ thickness of it. By this, resin is made to intervene between back surface 2*c* of semiconductor chip 2, and thin portion 1*f* of lead 1*a*, and thin portion 1*f* of lead 1*a* can be dived into the lower part of semiconductor chip 2.

Since thin portion 1*f* of each lead 1*a* is arranged at the back surface 2*c* side of semiconductor chip 2, tab 1*b* is a thing of the small tab structure formed smaller than the size of semiconductor chip 2 so that it might not interfere with thin portion 1*f* of each lead 1*a*.

In QFN 5, the plane which intersects the thickness is a quadrangle, for example, semiconductor chip 2 is formed with silicon etc., and the back surface 2*c* is connected and fixed to main surface 1*c* of tab 1*b* by die bond material 6.

Each lead 1*a* and tab 1*b* are formed with a copper alloy, for example, further, wire 4 is a gold wire, for example, and molded body 3 comprises a thermosetting epoxy resin etc., for example.

In QFN 5 shown in FIG. 2, the length (Lp) of the lead extending direction of mounting surface 1*g* of lead 1*a* is standard 0.6 mm, and the distance (La) from side face 2*d* of semiconductor chip 2 to side face 3*b* of molded body 3 can be shortened to about 0.35 mm in that case, for example.

Like QFN 5 of the short lead type shown in FIG. 3, the length (Lp) of lead 1*a* can be 0.45 mm, for example by adopting still shorter lead 1*a* in the same structure as QFN 5 of FIG. 2.

In QFN 5 of Embodiment 1, thin portion 1*f* formed thinly of each lead 1*a* is arranged diving into the lower part of semiconductor chip 2. Thereby, securing the length (Lp) of the lead extending direction of mounting surface 1*g* of each lead 1*a*, and holding the bond strength at the time of mounting, the distance (La) from side face 2*d* of semiconductor chip 2 to side face 3*b* of molded body 3 can be shortened as much as possible, package size can be brought close to chip size, and the miniaturization of QFN 5 can be aimed by this.

As stipulation of the horizontal length of the region of the side portion of semiconductor chip 2 in QFN 5, by making the length of wire connection surface 1*h* of a direction parallel to the extending direction of lead 1*a*, less than or equal to the length of the same direction of mounting surface 1*g*, for example, the miniaturization of QFN 5 can be aimed. Or, by making the distance (La) from side face 2*d* of semiconductor chip 2 to side face 3*b* of molded body 3 be 0.35 mm or less, the miniaturization of QFN 5 can be aimed.

In QFN 5 of Embodiment 1, by arranging thin portion 1*f* of each lead 1*a* diving into the lower part of semiconductor chip 2, only the part in which thin portion 1*f* is formed more thinly than thick portion 1*e* can make thickness of molded body 3 thin, and making QFN 5 thinner can be aimed.

In QFN 5, since tab 1*b* is arranged so that the back surface 1*d* may be exposed to back surface 3*a* of molded body 3, the heat emitted from semiconductor chip 2 can be made to be able to radiate outside from tab 1*b*, and the heat radiation nature of QFN 5 can be improved. Since tab 1*b* is exposed to back surface 3*a* of molded body 3, by using tab 1*b* for GND connection at the time of mounting to a mounting board, the GND reinforcement of QFN 5 can be aimed and GND can be stabilized.

Since it arranges so that tab 1*b* may be exposed to back surface 3*a* of molded body 3, making QFN 5 thinner can be aimed.

Figure 4:
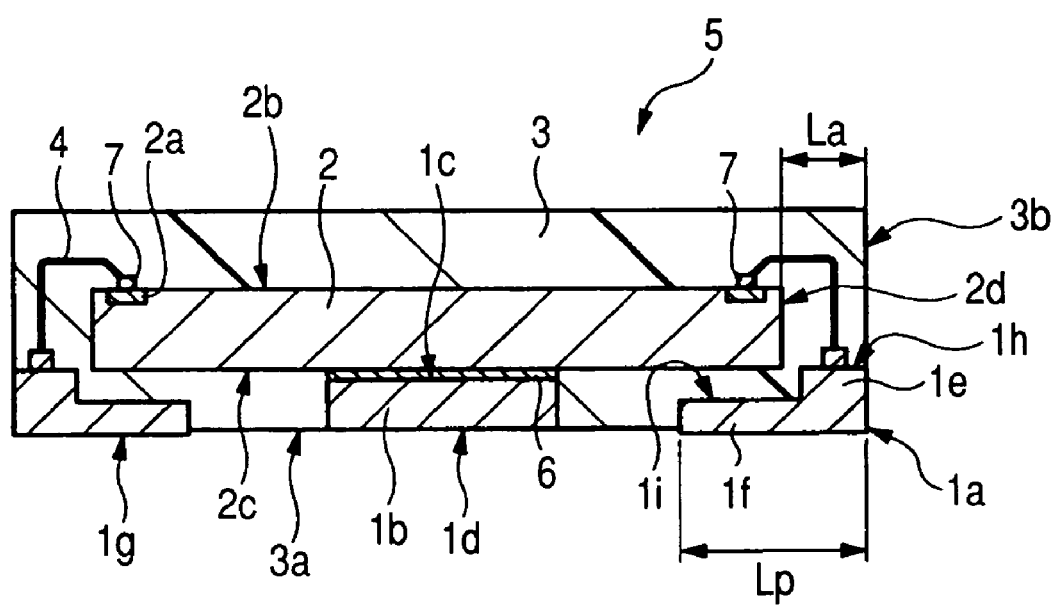
FIG. 4 is a sectional view showing an example of the reverse bonding type structure of the semiconductor device shown in FIG. 1.

Next, the structure of QFN 5 shown in FIG. 4 is explained.

QFN 5 shown in FIG. 4 is a thing of a reverse bonding type structure, and it aims at a miniaturization further, without changing chip size for QFN 5 shown in FIG. 3.

As opposed to having adopted the forward bonding method which connects the semiconductor chip 2 side previously first, and connects the lead 1*a* side after that in QFN 5 shown in FIG. 2 and FIG. 3 in the case of wire bonding, the reverse bonding method which connects the lead 1*a* side previously first, and connects the semiconductor chip 2 side after that in the case of wire bonding is used for QFN 5 shown in FIG. 4.

In wire bonding, the side connected previously (it is henceforth called the first bonding side) can stand up wire 4 almost vertically to a connection surface. Furthermore, the bonding area needed in said connection surface can be made small as compared with the side connected behind (it is henceforth called the second bonding side). Therefore, the first bonding is performed to the lead 1*a* side using this characteristic in the case of wire bonding. The length of wire connection surface 1*h* in thick portion 1*e* of lead 1*a* is reducible even to almost equivalent length (width) to the stud bump formed by wire bonding technology. As explained above, since wire 4 rises (is pulled out) to wire connection surface 1*h* of lead 1*a* almost perpendicularly from the stud bump formed in the first bonding side, the stress concerning root part 4*a* of wire 4 can be reduced compared with the forward bonding method. Thus, distance (La) from side face 2d of semiconductor chip 2 to side face 3b of molded body 3 can be made into the minimum, and the stress generated in root part 4a of wire 4 at the side of the first bonding can be reduced.

The length (Lp) of the lead extending direction of mounting surface 1g of each lead 1a has secured Lp=0.45 mm, for example in that case, and the bond strength at the time of substrate mounting is held.

Therefore, like QFN 5 shown in FIG. 4, by adopting the batch molding method and a reverse bonding method, distance (La) in QFN 5 can be made into the minimum, and the miniaturization of QFN 5 can be further aimed at rather than the structure shown in FIG. 2 and FIG. 3. In QFN 5 shown in FIG. 4, distance (La) is about 0.30 mm, for example.

Since the second bonding side of wire bonding is semiconductor chip 2 side in QFN 5 shown in FIG. 4, in the second bonding, wire 4, and pad 2a of semiconductor chip 2 will be connected. When wire 4 is a gold wire, gold bump 7 is connected on pad 2a beforehand, and it may be made to connect wire 4 to this gold bump 7 in the case of the second bonding, as shown in FIG. 4 since the surface of pad 2a of semiconductor chip 2 is an aluminum layer. Thus, in connecting wire 4, and pad 2a of aluminum of semiconductor chip 2 by the second bonding, the connection reliability of wire 4 and pad 2a can be increased more by connecting gold bump 7 on pad 2a beforehand, and connecting this gold bump 7 and wire 4.

However, even if wire 4 is connected directly to pad 2a, as long as it is satisfactory in particular on connection reliability, wire 4 and pad 2a may be connected directly, without using gold bump 7.

When forming gold bump 7 on pad 2a, it is preferred to form with the stud bump formation method using wire bonding technology.

Next, the various lead shapes in QFN 5 are explained. FIG. 5 shows an example of the shape of lead 1a built into QFN 5 shown in FIG. 1, and includes thick portion 1e and thin portion 1f, and thick portion 1e has wire connection surface (the second main surface) 1h. On the other hand, thin portion 1f whose thickness is thinner than thick portion 1e has stepped surface (the third main surface) 1i.

On the other hand, as for lead 1a of the modification shown in FIG. 6, irregularity 1j of corrugated form is formed in stepped surface 1i of the thin portion 1f. Thereby, the contact area of lead 1a and resin 8 for moldings (refer to FIG. 18) can be increased, and the degree of adhesion of lead 1a and resin 8 for moldings can be raised. By having formed irregularity 1j, the drawing-out strength from molded body 3 to the extending direction of lead 1a can be raised, and falling from molded body 3 of lead 1a can be reduced.

As for lead 1a of the modification shown in FIG. 7, dimples 1k which are a plurality of hollow portions are formed in stepped surface 1i of the thin portion 1f. And like the case of said irregularity 1j, the contact area of lead 1a and resin 8 for moldings can be increased, and the degree of adhesion of lead 1a and resin 8 for moldings can be raised. The drawing-out strength from molded body 3 to a package horizontal direction can be raised, and falling from molded body 3 of lead 1a can be reduced.

To lead 1a shown in FIG. 5, FIG. 6, and FIG. 7, lead 1a shown in FIG. 8-FIG. 13 forms the width of the right-angled direction over the extending direction of lead 1a, respectively so that wire connection surface 1h or stepped surface 1i may become larger than mounting surface 1g. That is, as shown in FIG. 9, FIG. 11, and FIG. 13, it is formed so that each lead 1a may become narrow towards mounting surface 1g, and the surface of the side portion of the long-side direction of each lead 1a forms slopes 1m. Therefore, it is formed so that the front shape of each lead 1a may become an inverted trapezoid, and thereby, the drawing-out strength from molded body 3 to the thickness direction of lead 1a can be raised, and falling from molded body 3 of lead 1a can be reduced.

In the case of the structure of said Patent Reference 1 (Japanese Unexamined Patent Publication No. 2003-37219), in the inner lead part, the depressed portion is formed between the second bonding point, and the side face of a molded body in order to improve the adhesion of resin and a lead. For this reason, even if it forms a molded body by individual molding, since the distance from the second bonding point to the side face of a molded body is fully secured, it does not expose from the side face of a molded body. However, with this structure, the package size nearer to chip size is unrealizable.

On the other hand, in Embodiment 1, thick portion 1e having wire connection surface 1h is formed only the region (length, width) in which wire bonding is possible. Therefore, since the depressed portion (groove) for improving adhesion with resin, for example etc. cannot be formed on wire connection surface 1h, for degree-of-adhesion reinforcement of lead 1a, structures as shown in FIG. 6 through FIG. 13 are effective. Only the part not forming a depressed portion (groove) on wire connection surface 1h can realize the miniaturization of package size.

Next, the manufacturing method of QFN 5 (semiconductor device) of Embodiment 1 is explained.

First, as shown in FIG. 14 and FIG. 15, lead frame 1 in which block formation of a plurality of device regions (device formation area) 1t was performed is prepared. One device region 1t includes a plurality of leads 1a having mounting surface 1g, and wire connection surface 1h arranged in the opposite side, having thick portion 1e having wire connection surface 1h, and thin portion 1f with thinner thickness than thick portion 1e, and with which the length of a lead extending direction of wire-connection surface 1h was formed shorter than mounting surface 1g further, respectively, and tab 1b having been arranged inside a plurality of leads 1a and being a chip mounting part. Thin portions if are what formed the thickness thinly rather than thick portion 1e by half etching processing or press working.

To lead frame 1, in frame part 1u of the outside of a plurality of device regions 1t to which block formation was performed, a plurality of first slits in for stress relaxation, second slits 1p for resin passage, long slits 1q for warp prevention of a frame, guide holes 1r for transportation, and tooling holes is are formed, respectively.

Then, die bonding is performed as shown in FIG. 16. Here, semiconductor chip 2 is mounted via die bond material 6 on main surface 1c of tab 1b of lead frame 1, and semiconductor chip 2 is adhered. In that case, semiconductor chip 2 is mounted over tab 1b so that back surface 2c of semiconductor chip 2 and thin portions if of lead 1a may oppose.

Wire bonding is performed as shown in FIG. 17 after die bonding. That is, pad 2a of semiconductor chip 2 and wire connection surface 1h of thick portion 1e of lead 1a are connected with wire 4.

In adopting reverse bonding as shown in FIG. 4 in that case, it first performs wire bonding of wire connection surface 1h of thick portion 1e of lead 1a, and the wire 4 previously. Thereby, since the first bonding side can complete bonding in the condition that wire 4 is stood up almost vertically to a connection surface, to wire connection surface 1*h* of lead 1*a*, it can connect standing up wire 4 almost vertically.

The area required for the bonding of the first bonding side is smaller than the second bonding side. Thereby, while being able to stand up wire 4 almost at right angles to wire connection surface 1*h*, wire connection surface 1*h* of thick portion 1*e* of lead 1*a* can be made into the minimum, and wire 4 can be stood up almost at right angles to this wire connection surface 1*h*. Therefore, distance (La) from side face 2*d* of semiconductor chip 2 to side face 3*b* of molded body 3 can be made into the minimum, and the stress generated in root part 4*a* of wire 4 at the side of the first bonding can be reduced.

Second bonding that connects wire 4, and pad 2*a* of semiconductor chip 2 is performed after termination of the first bonding. Wire 4, and gold bump 7 beforehand connected on pad 2*a* of semiconductor chip 2 are connected in that case. However, gold bump 7 is not necessarily needed to use.

When performing forward bonding as wire bonding (i.e., after performing first bonding on semiconductor chip 2 side, when performing second bonding on lead 1*a* side), as shown in FIG. 3, first, pad 2*a* of semiconductor chip 2 and wire 4 are connected as first bonding, and wire connection surface 1*h* of thick portion 1*e* of lead 1*a* and wire 4 are connected as second bonding after that.

Resin molding is performed after termination of wire bonding. That is, resin molding of semiconductor chip 2 and a plurality of wires 4 is performed so that each mounting surface (first main surface) 1*g* of a plurality of leads 1*a* may be exposed to the edge part of back surface 3*a* of molded body 3, and molded body 3 is formed. In the case of tab exposure structure, resin molding is performed so that tab 1*b* may also be exposed to back surface 3*a* of molded body 3.

In Embodiment 1, resin molding is performed by the batch molding method of covering a plurality of device regions (device formation area) 1*t* by which block formation was performed on lead frame 1 by one mold cavity of a resin-molding metal mold, and performing said resin molding at a resin molding step. In that case, as shown in FIG. 18, lead frame 1 is arranged on metal-mold surface 9*d* of upper die 9*a* of resin-molding metal mold 9. And a plurality of device regions 1*t* by which block formation was performed on lead frame 1 are covered for every desired number of blocks by each of a plurality of mold cavities 9*c* of upper die 9*a* of resin-molding metal mold 9, and resin molding is performed. That is, a block unit having included device regions 1*t* of the predetermined number is covered by one mold cavity 9*c*, and the batch molding in the condition of having divided for every block unit is performed. However, the method of adopting film seat 14 etc. and covering the terminal face of lead 1*a* so that each mounting surfaces (the first main surface) 1*g* of a plurality of leads 1*a* may be exposed, and preventing the mold resin leakage to an exposure terminal face is taken in this case.

Thus, by dividing the whole block unit, covering by one mold cavity 9*c*, and performing a batch molding, as shown in FIG. 19, batch molded body 10 divided into plurality can be formed on one lead frame 1. And the stress generated on lead frame 1 according to the difference of the amount of thermal contraction of resin (for example, thermosetting epoxy resin) and metal (for example, copper alloy) can be dispersed, and a warp in lead frame 1 can be reduced.

After resin molding, individual separation is performed separating each of a plurality of leads 1*a* from lead frame 1. Here, as shown in FIG. 20 and FIG. 21, dicing performs individual separation using blade 11, and this becomes assembly completion of QFN 5 as shown in FIG. 22.

Thus, in Embodiment 1, using lead frame 1 in which wire connection surface 1*h* of lead 1*a* was formed shorter than mounting surface 1*g*, semiconductor chip 2, like back surface 2*c* of semiconductor chip 2 and thin portion 1*h* of lead 1*a* oppose, is mounted on tab 1*b*, and is assembled. Thereby, as shown in FIG. 2 or FIG. 3, distance (La) from side face 2*d* of semiconductor chip 2 to side face 3*b* of molded body 3 can be shortened, as a result, package size can be brought close to chip size, and the miniaturization of QFN 5 can be aimed at.

By connecting wire connection surfaces (second main surface) 1*h* of lead 1*a*, and wire 4 previously in wire bonding, and connecting wire 4, and pad 2*a* of semiconductor chip 2 after that (reverse bonding), without shortening mounting surface 1*g* of lead 1*a*, by reverse bonding, as shown in FIG. 4, distance (La) of side face 2*d* of semiconductor chip 2 and side face 3*b* of molded body 3 can be shortened further.

As a result, it becomes possible to bring package size close to chip size more, without shortening mounting surface 1*g* of lead 1*a* exposed to back surface 3*a* of molded body 3, and the miniaturization of QFN 5 can be aimed at, without reducing the bond strength and the electrical property after substrate mounting. That is, it becomes possible to bring package size close to chip size more, and to aim at the miniaturization of QFN 5.

As Embodiment 1 explained, when reverse bonding is performed by performing resin molding by a batch molding, since wire 4 can be stood up almost at right angles to wire connection surface 1*h* of lead 1*a*, molded body 3 can be formed by a batch molding and the individual separation by subsequent dicing with width uniform on wire connection surface 1*h* of lead 1*a* (side portion of semiconductor chip 2). Thereby, wire 4 which stood up almost vertically on wire connection surface 1*h* by reverse bonding can fully be covered by resin.

In the case of forward bonding (wire bonding which performs first bonding to semiconductor chip 2, and performs second bonding to lead 1*a*), the batch molding is effective as well.

That is, when a batch molding and forward bonding are combined, second bonding in forward bonding is performed to wire connection surface 1*h* of lead 1*a*. In that case, since, in an individual molding (how to cover and perform resin molding of one device region it by one mold cavity 9*c*) type as shown in FIG. 23 of semiconductor device, cutting margin 1*v* is needed at the outside end of wire connection surface 1*h* of lead 1*a*, wire connection surface 1*h* becomes narrow, and the bonding conditions at the side of the second bonding become severe. On the other hand, in a batch molding, since wire connection surface 1*h* of lead 1*a* is covered by resin just before an outside end as shown in FIG. 22, a leeway is given on the bonding conditions at the side of the second bonding over wire connection surface 1*h* of lead 1*a*.

Therefore, the batch molding is dramatically effective also to forward bonding or reverse bonding while it is dramatically effective to lead 1*a* with small wire connection surface 1*h*.

Embodiment 2

Figure 24:
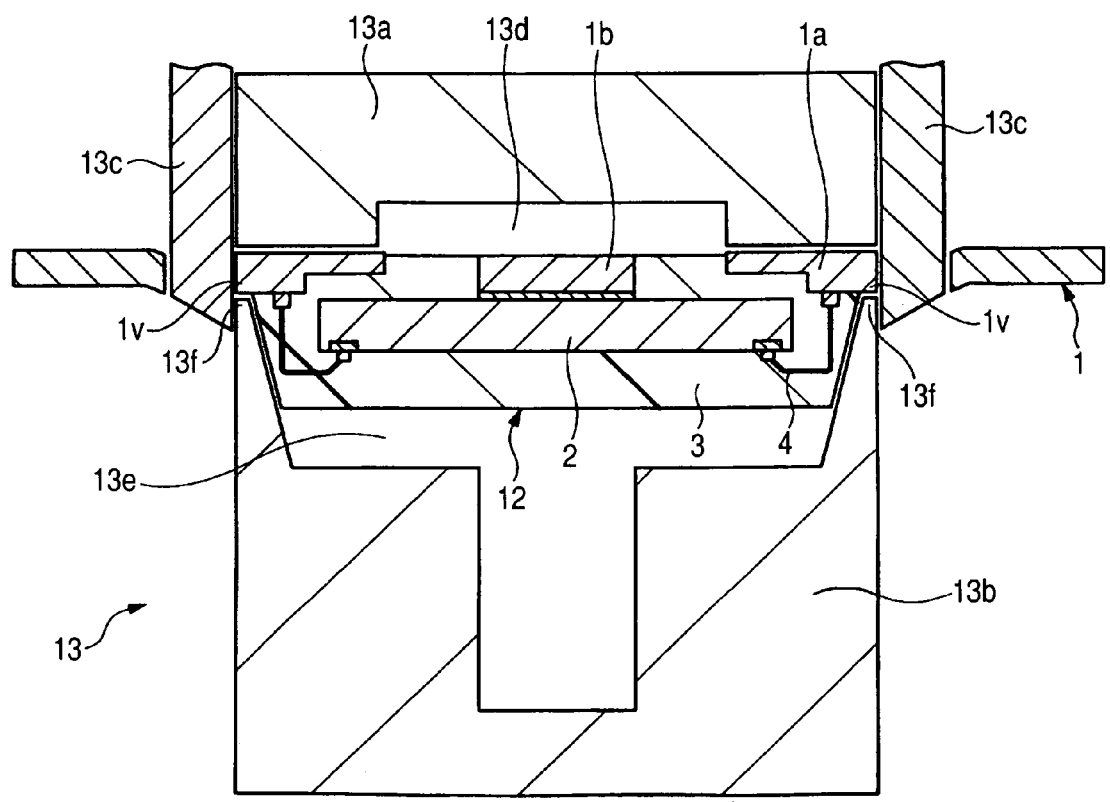
FIG. 24 is a sectional view showing an example of the structure at the time of the individual separation cut in the assembly of the semiconductor device of Embodiment 2 of the present invention.

FIG. 23 is a sectional view showing an example of the structure of the semiconductor device of Embodiment 2 of the present invention; and FIG. 24 is a sectional view showing an example of the structure at the time of the individual separation cut in the assembly of the semiconductor device of Embodiment 2 of the present invention.

The semiconductor device of Embodiment 2 is QFN 12 which brought package size close to chip size like QFN 5 of Embodiment 1. However, it is the semiconductor device to which individual molding was performed at the resin molding step, and which was further individually separated performing the cut using cutting die 13 as shown in FIG. 24 at the individual separation step.

Namely, QFN 12 shown in FIG. 23 has a plurality of leads 1a which have thin portion 1f, and thick portion 1e in each like QFN 5 of Embodiment 1. And back surface 2c of semiconductor chip 2 and thin portion 1f of each lead 1a are arranged face to face, and thin portion 1f of each lead 1a is diving into back surface 2c side of semiconductor chip 2. Thereby, while shortening distance of side face 2d of semiconductor chip 2, and side face 3b of molded body 3, reverse bonding is performed in wire bonding, package size can be brought close to chip size, and the miniaturization can be aimed at.

In the assembly of QFN 12, reverse bonding which connects wire 4 to wire connection surface 1h of thick portion 1e of lead 1a as first bonding, and connects wire 4 to pad 2a of semiconductor chip 2 as second bonding after that in the case of wire bonding is performed. After wire bonding, by individual molding, resin molding is performed and molded body 3 is formed.

Embodiment 1 explained QFN 5 in which molded body 3 was formed by the batch molding method after performing wire bonding by reverse bonding. As described above, the distance (La) from side face 2d of semiconductor chip 2 to side face 3b of molded body 3 can be reduced as performing wire bonding by reverse bonding. In other words, if it is formed so that cutting margin 1v may be formed, and side face 3b of molded body 3 may turn into a slope (taper) by individual molding, the length (width) of wire connection surface 1h will become short. However, in the case of the wire bonding by reverse bonding, the bonding area at the side of the first bonding can be reduced rather than the bonding area of the second side. Therefore, even if the distance from side face 3b of molded body 3 formed by individual molding to side face 2d of semiconductor chip 2 becomes narrow, it can be formed, without wire 4 being exposed from side face 3b of molded body 3.

Individual separation is performed at an individual separation step after a resin molding step using cutting die 13 shown in FIG. 24. In that case, lead frame 1 is pinched with upper die 13a and lower die 13b of cutting die 13, and cutting blade 13c performs lead trimming. The width at a head of the part which supports lead frame 1 by support portion 13f of lower die 13b is about 0.1 mm, therefore cutting margin 1v of each lead 1a shown in FIG. 23 is also about 0.1 mm.

In the cut of lead 1a, one corner part corresponding to a gate cuts first (gate cut). Next, lead trimming (pinch cutting) is performed by three corner parts which remain, and a plurality of leads 1a formed corresponding to the side of the direction of either of the two directions are cut further (lead tip cut of the side of X). Then, a plurality of leads 1a formed corresponding to the side of the direction of any another side of the two directions are cut (lead tip cut of the side of Y). That is, in lead trimming, lead trimming is performed dividing into four steps.

Roll off 13d and 13e is formed in upper die 13a and lower die 13b of cutting die 13, respectively. That is, a clearance is formed by having formed roll off 13d and 13e, respectively between upper die 13a and molded body 3 and between lower die 13b and molded body 3. And especially at the time of lead trimming, cut waste can be dropped to roll off 13e, without inserting said cut waste of lead 1a, resin, etc., between lower die 13b and molded body 3. Thereby, it can be prevented that a blemish is formed in molded body 3 with said cut waste.

Roll off 13d of upper die 13a serves as shape which escaped tab 1b, and it is formed so that only lead 1a may be pressed down at the time of lead trimming. Thereby, a pressure is not given to tab 1b at the time of lead trimming, but grant of the pressure to semiconductor chip 2 can be avoided.

Thus, lead trimming is performed and the assembly of QFN 12 shown in FIG. 23 is completed.

Even if individual molding is performed and individual separation is performed by lead trimming after that like QFN 12 of Embodiment 2, package size can be brought close to chip size, and the miniaturization of QFN 12 can be aimed at.

As things mentioned above, the present inventions accomplished by the present inventor were concretely explained based on above embodiments, but the present inventions are not limited by above embodiments, but variations and modifications may be made, of course, in various ways in the limit that does not deviate from the gist.

For example, said Embodiment 1 explained the case where a batch molding was performed dividing for every block unit and covering a plurality of device regions 1t by one mold cavity 9c for every block as a batch molding. However, as said batch molding, all the device regions 1t formed on lead frame 1 may be covered by one mold cavity 9c, without dividing for every block, and a batch molding may be performed.

Figure 25:
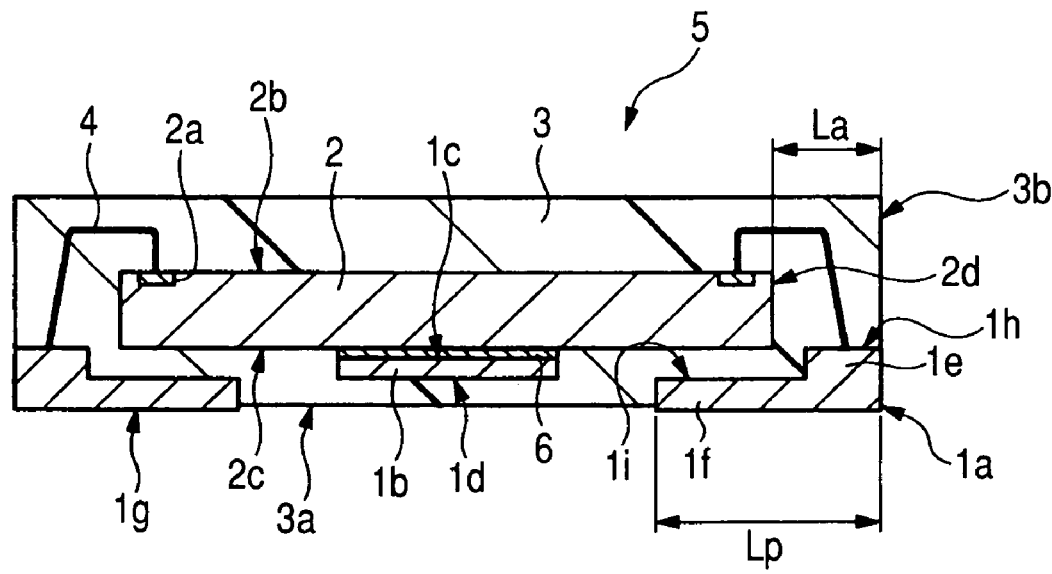
FIG. 25 is a sectional view showing the structure of QFN of a tab built-in type which is a modification of the present invention.
Figure 26:
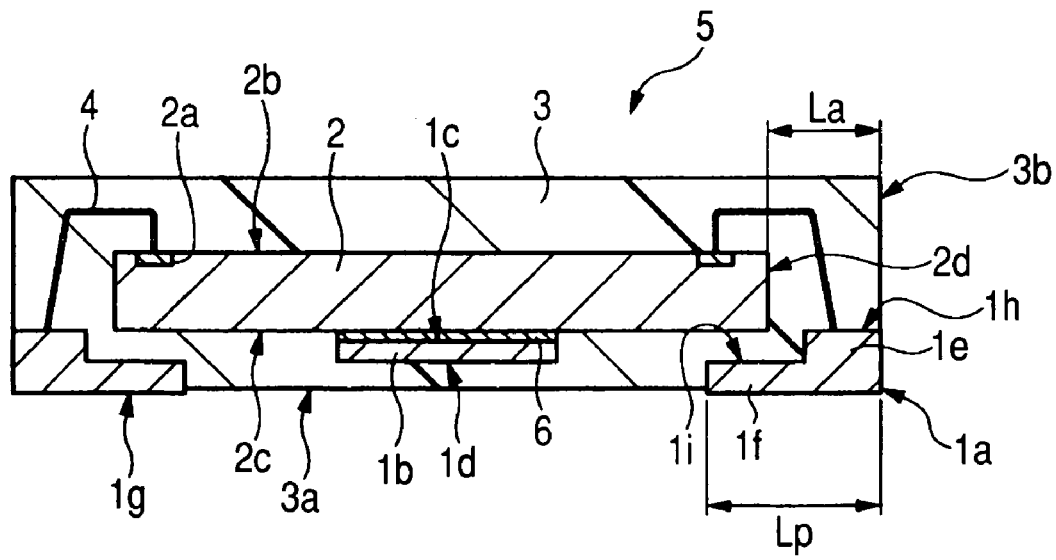
FIG. 26 is a sectional view showing the structure of QFN of a tab built-in type which is a modification of the present invention.
Figure 27:
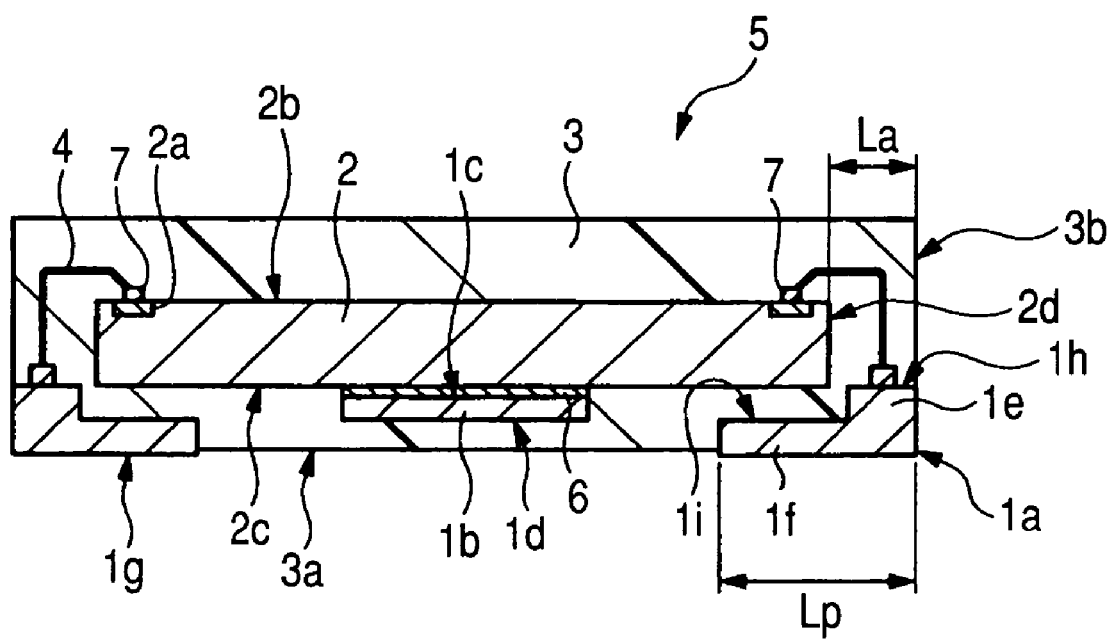
FIG. 27 is a sectional view showing the structure of QFN of a tab built-in type which is a modification of the present invention.

Said Embodiment 1 and 2 explained the structure that tab 1b exposes from back surface 3a of molded body 3. However, half etching may be performed to tab 1b toward main surface 1c from the back surface id, and tab 1b may be made to build in in molded body 3, as shown in FIG. 25-FIG. 27. By making tab 1b build in molded body 3, the region where wiring of a wiring pattern at the side of the mounting board which mounts QFN 5 is made becomes large comparing the case exposing tab 1b from back surface 3a of molded body 3, and a degree of freedom can be improved.

The present invention is suitable for the manufacturing technology of an electronic device and a semiconductor device.

What is claimed is:

1. A manufacturing method of a semiconductor device, comprising the steps of:
   (a) providing a semiconductor chip including a main surface over which a plurality of electrodes are formed, and a back surface opposing to the main surface;
   (b) providing a lead frame including a chip mounting part, and a plurality of leads arranged around the chip mounting part, a size of the chip mounting part is smaller than that of the semiconductor chip, and each of the plurality of leads has a first main surface, a second main surface opposing to the first main surface, and a third main surface which is disposed at a height between the first main surface and the second main surface, and which is arranged nearer the chip mounting part than the first main surface is the chip mounting part; wherein a width of the second main surface and a width of the third main surface of at least one lead, of said plurality of leads, in a direction perpendicular to a direction that the at least one leads extends, is greater than a width of said first surface of the at least one lead in said direction perpendicular to the direction that the at least one lead extends;

(c) mounting the semiconductor chip over the chip mounting part such that the back surface of the semiconductor chip is opposed to the third main surface of each of the plurality of leads;

(d) electrically connecting the plurality of electrodes of the semiconductor chip with the second main surface of each of the plurality of leads through conductive wires, respectively;

(e) forming a molded body sealing the semiconductor chip and the conductive wires such that the first main surface of each of the plurality of leads is exposed from a mounting surface of the molded body; and (f) individually separating each of the plurality of leads from the lead frame.

2. A manufacturing method of a semiconductor device according to claim 1, wherein
the back surface of the chip mounting part is exposed to the back surface of the molded body.

3. A manufacturing method of a semiconductor device according to claim 1, wherein
the back surface of the chip mounting part is covered by the molded body.

4. A manufacturing method of a semiconductor device according to claim 1, wherein in the step (e), the step of forming a molded body is performed so as to cover a plurality of device formation areas formed on the lead frame, using one mold cavity of a resin-molding metal mold; and in the step (f), the individual separation is performed by dicing.

5. A manufacturing method of a semiconductor device according to claim 1, wherein in the step (e), the step of forming a molded body is performed so as to cover a plurality of device formation areas formed on the lead frame by a plurality of mold cavities of a resin-molding metal mold, each mold cavity of the plurality of mild cavities covering a plural number of the plurality of device formation areas.

6. A manufacturing method of a semiconductor device according to claim 1, wherein irregularity is formed in the third main surface of each of the plurality of leads which is arranged opposing the back surface of the semiconductor chip.

7. A manufacturing method of a semiconductor device according to claim 1, wherein a plurality of hollow portions are formed in the third main surface of each of the plurality of leads which is arranged opposing the back surface of the semiconductor chip.

8. A manufacturing method of a semiconductor device according to claim 1, wherein each of said plurality of leads has a first portion and a second portion, the first portion being thicker than said second portion, and the second main surface forms an upper surface of the first portion, the third main surface forming an upper surface of the second portion.

9. A manufacturing method of a semiconductor device according to claim 8, wherein said first main surface forms a lower surface of both said first portion and said second portion of the plurality of leads.

10. A manufacturing method of a semiconductor device according to claim 1, wherein a length of the third main surface in a lead extending direction is greater than a length of the second main surface in the lead extending direction.

11. A manufacturing method of a semiconductor device according to claim 1, wherein the step of providing the semiconductor chip includes preparing the semiconductor chip, and the step of providing the lead frame includes preparing the lead frame.

12. A manufacturing method of a semiconductor device according to claim 1, wherein in step (c), a periphery of the back surface of the semiconductor chip is exposed from the chip mounting part.

13. A manufacturing method of a semiconductor device according to claim 1, wherein a width of the second main surface and a width of the third main surface of at least one lead, of said plurality of leads, in a direction perpendicular to a direction that the at least one lead extends, is greater than a width of said first surface of the at least one lead in said direction perpendicular to the direction that the at least one lead extends.

14. A manufacturing method of a semiconductor device according to claim 13, wherein a cross-section of said at least one lead, in said direction perpendicular to the direction that the at least one lead extends, is a trapezoid.

15. A manufacturing method of a semiconductor device, comprising the steps of:

(a) providing a semiconductor chip including a main surface over which a plurality of electrodes are formed, and a back surface opposing to the main surface;

(b) providing a lead frame including a chip mounting part, and a plurality of leads arranged around the chip mounting part, a size of the chip mounting part is smaller than that of the semiconductor chip, and each of the plurality of leads has a first main surface, a second main surface opposing to the first main surface, and a third main surface which is disposed at a height between the first main surface and the second main surface, and which is arranged nearer the chip mounting part than the first main surface is the chip mounting part; wherein a width of the second main surface and a width of the third main surface of at least one lead, of said plurality of leads, in a direction perpendicular to a direction that the at least one leads extends, is greater than a width of said first surface of the at least one lead in said direction perpendicular to the direction that the at least one lead extends;

(c) mounting the semiconductor chip over the chip mounting part such that the back surface of the semiconductor chip is opposed to the third main surface of each of the plurality of leads;

(d) electrically connecting the plurality of electrodes of the semiconductor chip with the second main surface of each of the plurality of leads through conductive wires, respectively;

(e) forming a molded body sealing the semiconductor chip and the conductive wires such that the first main surface of each of the plurality of leads is exposed from a mounting surface of the molded body; and (f) individually separating each of the plurality of leads from the lead frame by dicing; wherein in the step (d), the conductive wires are electrically connected with the plurality of electrodes of the semiconductor chip after being electrically connected with the second main surface of each of the plurality of leads.

16. A manufacturing method of a semiconductor device according to claim 15, wherein
the back surface of the chip mounting part is exposed to the back surface of the molded body.

17. A manufacturing method of a semiconductor device according to claim 15, wherein
the back surface of the chip mounting part is covered by the molded body.

18. A manufacturing method of a semiconductor device according to claim 15, wherein irregularity is formed in the third main surface of each of the plurality of leads which is arranged opposing the back surface of the semiconductor chip.

19. A manufacturing method of a semiconductor device according to claim 15, wherein a plurality of hollow portions are formed in the third main surface of each of the plurality of leads which is arranged opposing the back surface of the semiconductor chip.

20. A manufacturing method of a semiconductor device according to claim 15, wherein a width of the second main surface and a width of the third main surface of at least one lead, of said plurality of leads, in a direction perpendicular to a direction that the at least one lead extends, is greater than a width of said first surface of the at least one lead in said direction perpendicular to the direction that the at least one lead extends.

21. A manufacturing method of a semiconductor device according to claim 20, wherein a cross-section of said at least one lead, in said direction perpendicular to the direction that the at least one lead extends, is a trapezoid.

22. A manufacturing method of a semiconductor device according to claim 15, wherein each of said plurality of leads has a first portion and a second portion, the first portion being thicker than said second portion, and the second main surface forms an upper surface of the first portion, the third main surface forming an upper surface of the second portion.

23. A manufacturing method of a semiconductor device according to claim 22, wherein said first main surface forms a lower surface of both said first portion and said second portion of the plurality of leads.

24. A manufacturing method of a semiconductor device according to claim 15, wherein a length of the third main surface of a lead extending direction is greater than a length of the second main surface in the lead extending direction.

25. A manufacturing method of a semiconductor device according to claim 15, wherein the step of providing the semiconductor chip includes preparing the semiconductor chip, and the step of providing the lead frame includes preparing the lead frame.

26. A manufacturing method of a semiconductor device according to claim 15, wherein in step (c), a periphery of the back surface of the semiconductor chip is exposed from the chip mounting part.

* * * * *